US009585288B2

(12) United States Patent
Powers et al.

(10) Patent No.: US 9,585,288 B2
(45) Date of Patent: Feb. 28, 2017

(54) BAFFLE PLATE ASSEMBLY

(71) Applicant: ADC Telecommunications, Inc., Berwyn, PA (US)

(72) Inventors: Clifton Cary Powers, Raleigh, NC (US); Yiu Lam Chan, Raleigh, NC (US); Chia-Hsing Liao, Taoyuan County (TW); Ying-Chou Su, Taoyuan County (TW)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 14/299,722

(22) Filed: Jun. 9, 2014

(65) Prior Publication Data
US 2015/0076097 A1    Mar. 19, 2015

Related U.S. Application Data

(60) Provisional application No. 61/832,495, filed on Jun. 7, 2013.

(51) Int. Cl.
*H05K 7/20* (2006.01)
*H05K 7/18* (2006.01)
*H04Q 1/02* (2006.01)

(52) U.S. Cl.
CPC .......... *H05K 7/20572* (2013.01); *H04Q 1/02* (2013.01); *H04Q 1/09* (2013.01); *H05K 7/186* (2013.01)

(58) Field of Classification Search
CPC   A47B 96/027; A47B 96/028; H05K 7/20709; H05K 7/20; H05K 7/18; H05K 7/20545; H05K 7/20554; H05K 7/20563; H05K 7/20572; H05K 7/20581; H05K 7/20718; H05K 7/20727; H05K 7/20736; H05K 7/186; H05K 7/1425; H05K 9/0062; H04Q 1/09; H04Q 1/02
USPC ...... 211/183, 134, 190, 193, 26, 189, 90.02; 108/108
See application file for complete search history.

(56) References Cited

U.S. PATENT DOCUMENTS

| | | | | |
|---|---|---|---|---|
| 3,556,306 | A * | 1/1971 | Shell | 211/90.02 |
| 3,730,264 | A * | 5/1973 | Krylow | H05K 7/20545 165/128 |
| 3,874,444 | A * | 4/1975 | Perce | H05K 7/20545 165/122 |
| 4,269,318 | A * | 5/1981 | Levitt et al. | 211/153 |
| 4,892,044 | A * | 1/1990 | Welsch | 108/154 |
| 4,938,442 | A * | 7/1990 | Mastrodicasa | 248/250 |

(Continued)

*Primary Examiner* — Joshua Rodden
*Assistant Examiner* — Hiwot Tefera
(74) *Attorney, Agent, or Firm* — Merchant & Gould P.C.

(57) ABSTRACT

A baffle plate assembly for installation in a rack structure is disclosed. In one aspect, the baffle plate assembly is configured to direct cooling air from a front side of the rack structure to cooling air inlet(s) of equipment located directly above the baffle plate assembly, and to block heated air from below or behind the baffle plate assembly from entering the equipment cooling air inlet(s). In one aspect, the baffle plate assembly includes a baffle plate defining a first surface plane, a pair of side plates, and a pair of mounting brackets. The side plates are configured to extend along the baffle plate while the mounting brackets may be attached to the side plates. In one aspect, the baffle plate first surface plane forms an oblique angle with respect to a plane defined by a first plate member of the mounting brackets.

15 Claims, 15 Drawing Sheets

(56) References Cited

U.S. PATENT DOCUMENTS

| | | | | |
|---|---|---|---|---|
| 5,088,607 | A * | 2/1992 | Risafi | A47B 57/42 |
| | | | | 211/187 |
| 5,720,230 | A * | 2/1998 | Mansfield | 108/108 |
| 5,806,689 | A * | 9/1998 | Mays et al. | 211/59.2 |
| 6,202,570 | B1 * | 3/2001 | Kurtsman | 108/108 |
| 7,126,820 | B2 * | 10/2006 | Wei | H04Q 1/15 |
| | | | | 361/690 |
| 7,173,817 | B2 * | 2/2007 | Wei | H05K 7/20736 |
| | | | | 361/679.48 |
| 7,426,111 | B2 * | 9/2008 | Sonobe | H05K 7/20572 |
| | | | | 361/694 |
| 7,523,903 | B1 * | 4/2009 | Rindoks et al. | 248/250 |
| 7,562,779 | B2 * | 7/2009 | Bravo | H05K 7/1449 |
| | | | | 211/26 |
| 8,256,628 | B2 * | 9/2012 | Stafford | A47F 5/0025 |
| | | | | 108/108 |
| 8,913,866 | B2 * | 12/2014 | Cote | G02B 6/4453 |
| | | | | 361/600 |
| 2002/0027766 | A1 * | 3/2002 | Negishi | H05K 7/20181 |
| | | | | 361/645 |
| 2003/0010490 | A1 * | 1/2003 | Reeck | H05K 7/20572 |
| | | | | 165/222 |
| 2004/0178156 | A1 * | 9/2004 | Knorring et al. | 211/59.2 |
| 2004/0251220 | A1 * | 12/2004 | Mertesdorf et al. | 211/26 |
| 2005/0022967 | A1 * | 2/2005 | Hall | H05K 7/20572 |
| | | | | 165/80.2 |
| 2007/0221103 | A1 * | 9/2007 | Trausch | A47B 57/045 |
| | | | | 108/108 |
| 2007/0258211 | A1 * | 11/2007 | Sonobe | H05K 7/20572 |
| | | | | 361/695 |
| 2011/0097053 | A1 * | 4/2011 | Smith | H04Q 1/142 |
| | | | | 385/135 |
| 2011/0235985 | A1 * | 9/2011 | Cote | G02B 6/4453 |
| | | | | 385/135 |

* cited by examiner

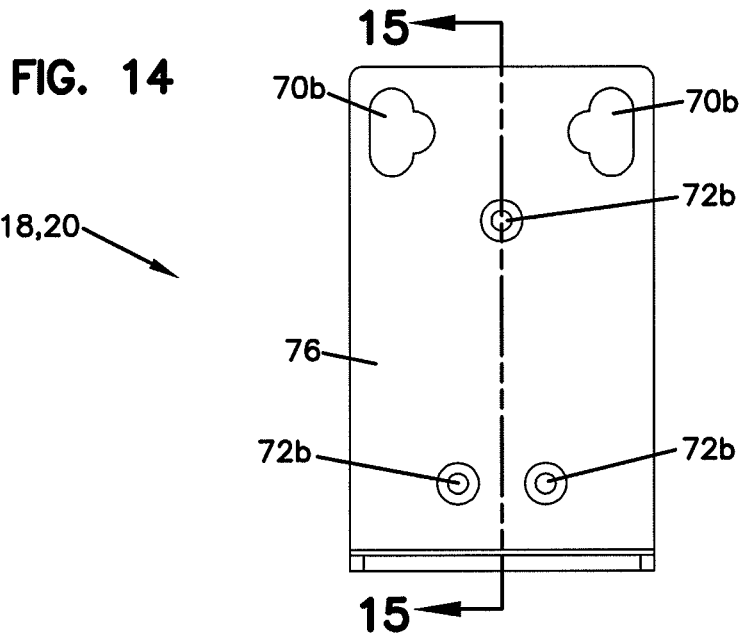
FIG. 14
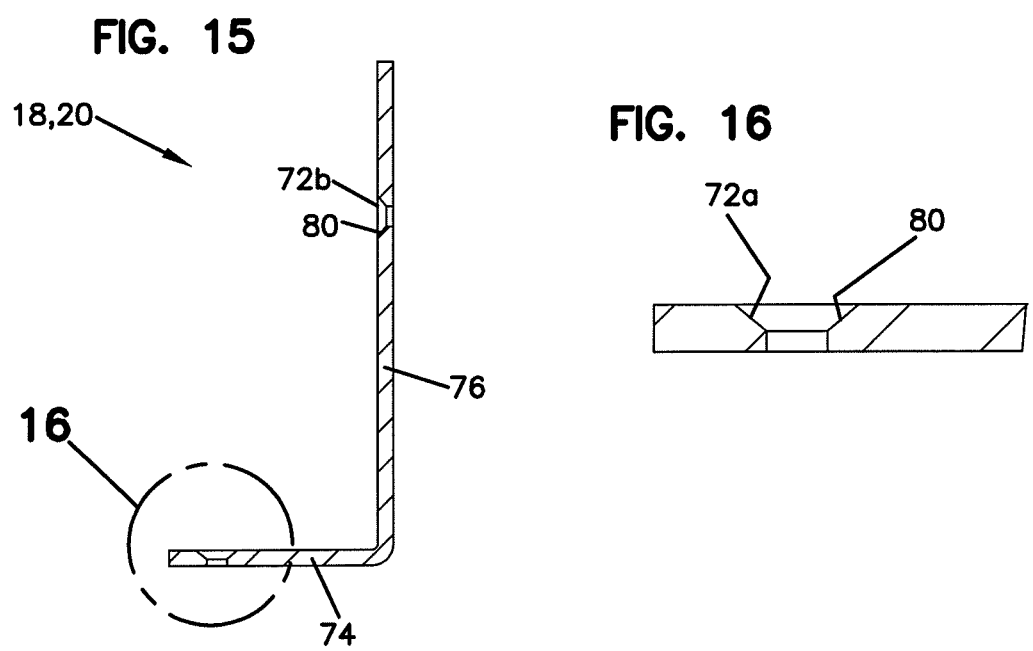
FIG. 15
FIG. 16

BAFFLE PLATE ASSEMBLY

CROSS-REFERENCE TO RELATED APPLICATION

The present application claims the benefit of U.S. Provisional Patent Application Ser. No. 61/832,495, filed Jun. 7, 2013, which application is hereby incorporated by reference in its entirety.

BACKGROUND

In many data and telecommunications rack systems, the equipment installed within the rack must be provided with adequate cooling air to ensure proper operation of the equipment. In some cases, heat emanating from adjacent or nearby equipment can interfere with the cooling of other equipment. Also, some racks are configured such that cooling air is provided from the front side of the rack and ejected to the back side of the rack. In the case of equipment that has a bottom inlet for cooling air, it is therefore desirable to guide the air from the front of the rack into the bottom inlet, and to block airflow from the rear of the rack. While systems have been developed to achieve this purpose, improvements are desired, particularly with regard to structural integrity and adjustability.

SUMMARY

A baffle plate assembly for installation in a rack structure is disclosed. In one aspect, the baffle plate assembly is configured to direct cooling air from a front side of the rack structure to cooling air inlet(s) of equipment located directly above the baffle plate assembly, and to block heated air from below or behind the baffle plate assembly from entering the equipment cooling air inlet(s). The baffle plate assembly includes a baffle plate, a pair of side plates, and a pair of mounting brackets. The baffle plate has a first surface plane extending between opposite first and second side edges and extending between a front edge and a rear edge. The pair of side plates can include a first side plate extending along the first side edge of the baffle plate and a second side plate extending along the second side edge of the baffle plate. The pair of mounting brackets may include a first mounting bracket attached to the first side plate and a second mounting bracket attached to the second side plate. Each of the pair of mounting brackets can be configured to have a first plate member and a second plate member wherein the first plate member is generally orthogonal to the second plate member. In one aspect, the first plate member is attached to the first or second side plate and the second plate member is positioned for attachment to the rack structure. The baffle plate assembly can be configured such that first surface plane of the baffle plate forms an oblique angle with respect to a plane defined by the first plate member of each of the first and second mounting brackets.

In one aspect, the baffle plate or the baffle plate assembly is provided with one or more support tabs located along the first and second side edges of the baffle plate. As shown, the first and second side plates are adjacent to and attached to the support tabs. The baffle plate can be provided with a first pair of support tabs located on the first side edge of the baffle plate and a second pair of support tabs located on the second side edge of the baffle plate. One of the first pair of support tabs can be located adjacent the baffle plate front edge and the other of the first pair of support tabs can be located adjacent the baffle plate rear edge. One of the second pair of support tabs can be located adjacent the baffle plate front edge and the other of the second pair of support tabs can be located adjacent the baffle plate rear edge. The support tabs located adjacent the baffle plate front edge extend away from the baffle plate first surface plane in a first direction while the support tabs located adjacent the baffle plate rear edge extend away from the baffle plate first surface plane in a second direction that is opposite the first direction. In one aspect, the first and second side plates are welded to the respective adjacent support tabs, for example by spot welding. In one example, two spot welds are provided for each connection between a side plate and a support tab.

DESCRIPTION OF THE DRAWINGS

Non-limiting and non-exhaustive embodiments are described with reference to the following figures, which are not necessarily drawn to scale, wherein like reference numerals refer to like parts throughout the various views unless otherwise specified.

FIG. 14 is a second side view of the mounting bracket shown in FIG. 12.

FIG. 15 is a cross-sectional view of the mounting bracket shown in FIG. 12, taken along the line 15-15 shown in FIG. 14.

FIG. 16 is an enlarged view of a portion of the mounting bracket shown in FIG. 12, as indicated at detail 16 shown in FIG. 15.

DETAILED DESCRIPTION

Figure 1:
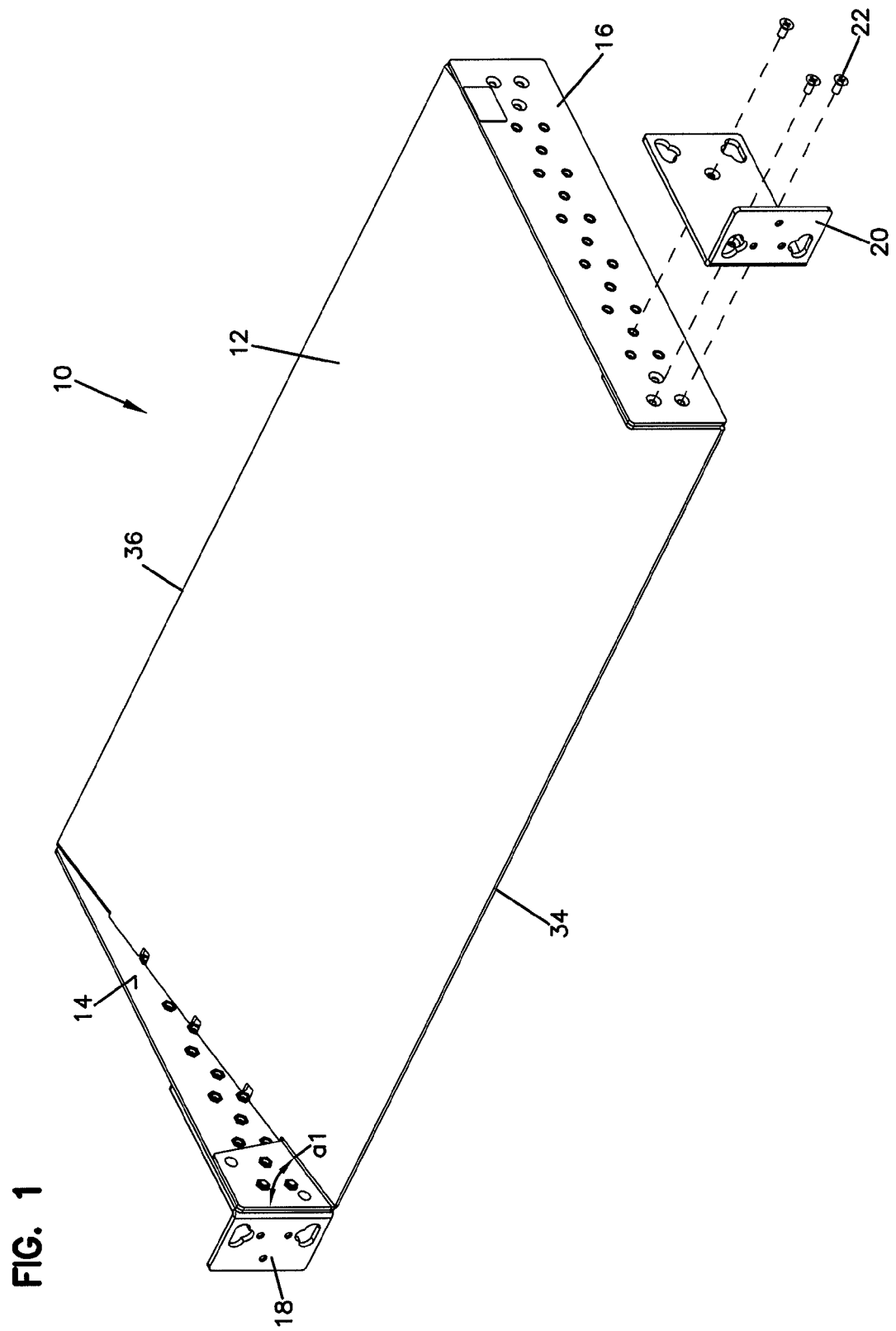
FIG. 1 is a perspective view of a baffle plate assembly having features that are examples of aspects in accordance with the principles of the present disclosure.
Figure 2:
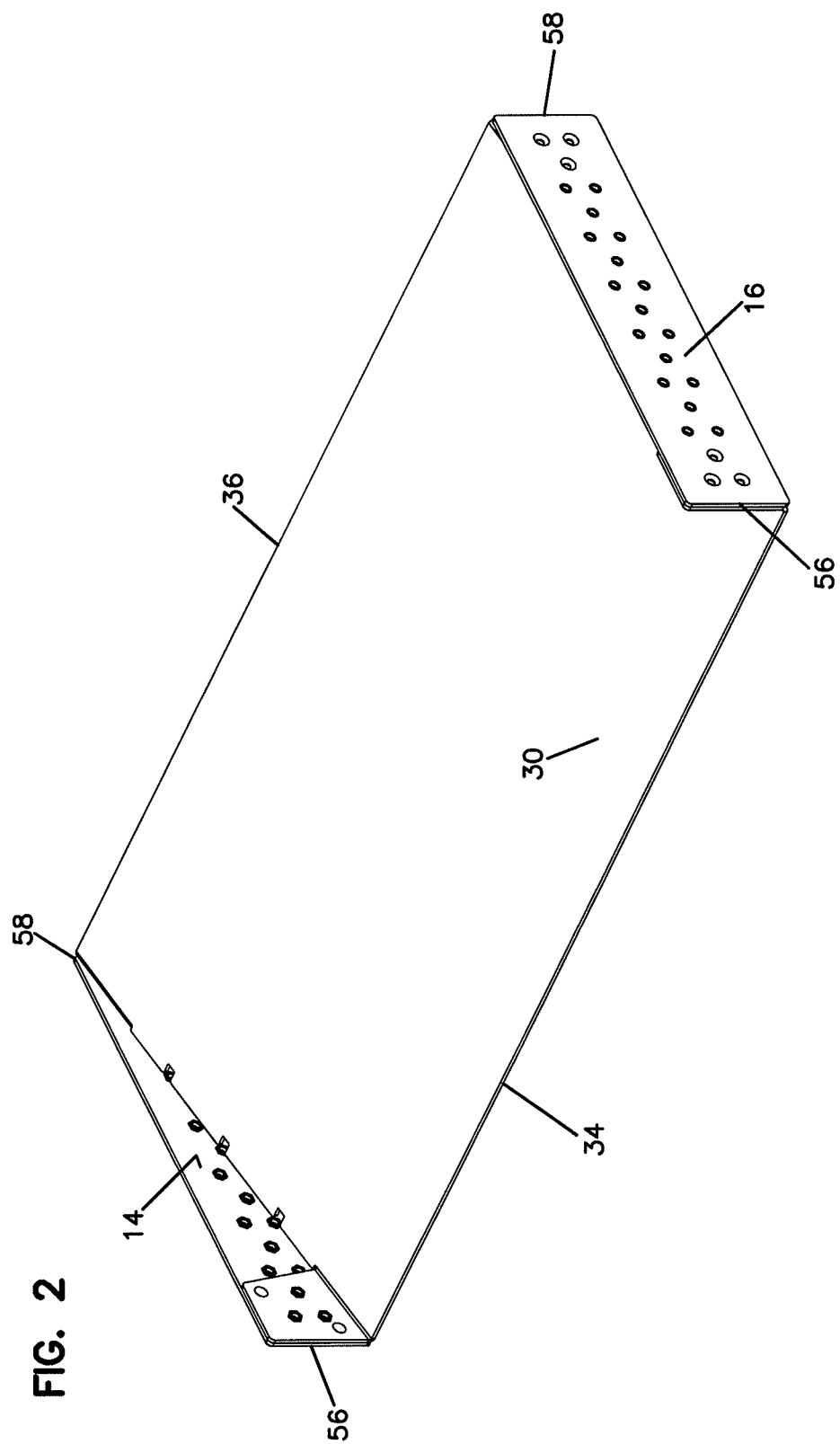
FIG. 2 is a perspective view of the baffle plate assembly shown in FIG. 1, without the mounting brackets installed.
Figure 3:
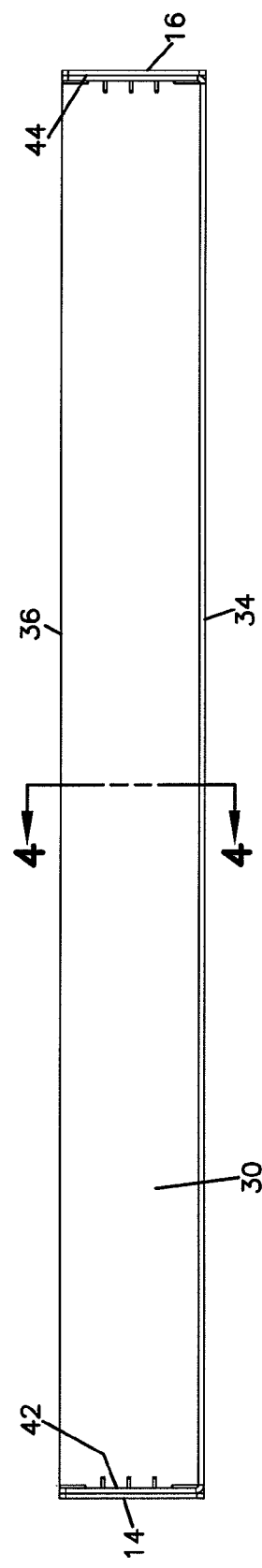
FIG. 3 is a front view of the baffle plate assembly shown in FIG. 2.

Various embodiments will be described in detail with reference to the drawings, wherein like reference numerals represent like parts and assemblies throughout the several views. Reference to various embodiments does not limit the scope of the claims attached hereto. Additionally, any examples set forth in this specification are not intended to be limiting and merely set forth some of the many possible embodiments for the appended claims.

Referring to FIG. 1, a baffle plate assembly 10 is presented. The baffle plate assembly 10 is configured for mounting in a rack structure 100 (e.g. a telecommunications rack), as shown in FIGS. 17-22 (discussed later) such that airflow from the front side of the rack structure 100 can be properly directed to other mounted equipment 200 in the rack. For example, where the baffle plate assembly 10 is mounted below equipment 200 that has a bottom cooling air inlet, the baffle plate assembly 10 operates to direct air from the front side of the rack to the bottom air inlet while simultaneously shielding the bottom air inlet from heated air emanating from other equipment 300 mounted at a lower location within the rack, and from air behind the rack 100 and baffle plate assembly 10.

As shown, the baffle plate assembly 10 includes a baffle plate 12, a first side plate 14, a second side plate 16, a first mounting bracket 18, and a second mounting bracket 20. Although each of these components is shown in the drawings as being a separate part, it should be understood that some or all of the components could be integral to each other. However, where adjustability of the mounting location of the baffle plate assembly 10 with respect to the rack 100 is desired, it is preferable for at least the mounting brackets 18, 20 to be repositionable with respect to the other components. For example, the mounting brackets 18, 20 can be configured for mounting to the side plates 14, 16 and/or the baffle plate 12 with fasteners 22, such as machine screws.

Figure 5:
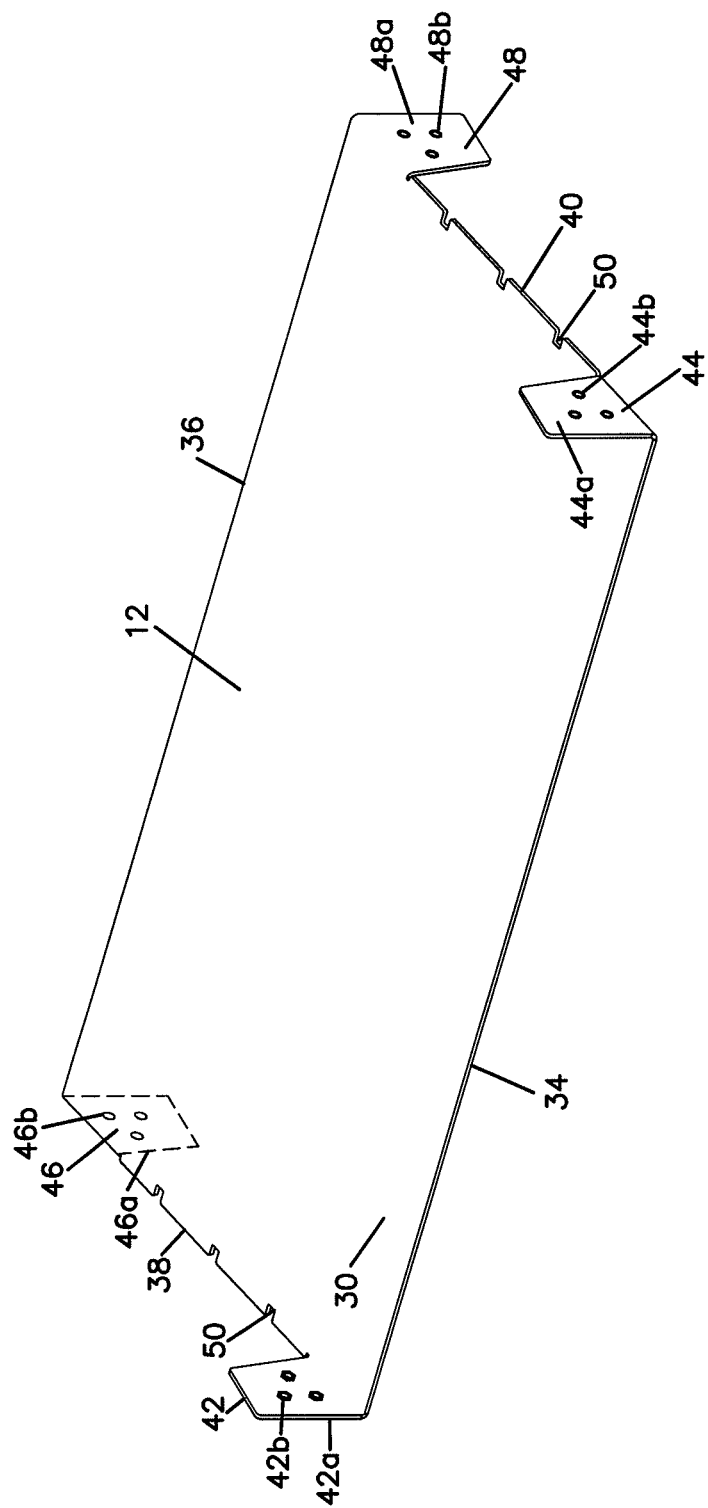
FIG. 5 is a perspective view of the baffle plate of the baffle plate assembly shown in FIG. 1.
Figure 6:
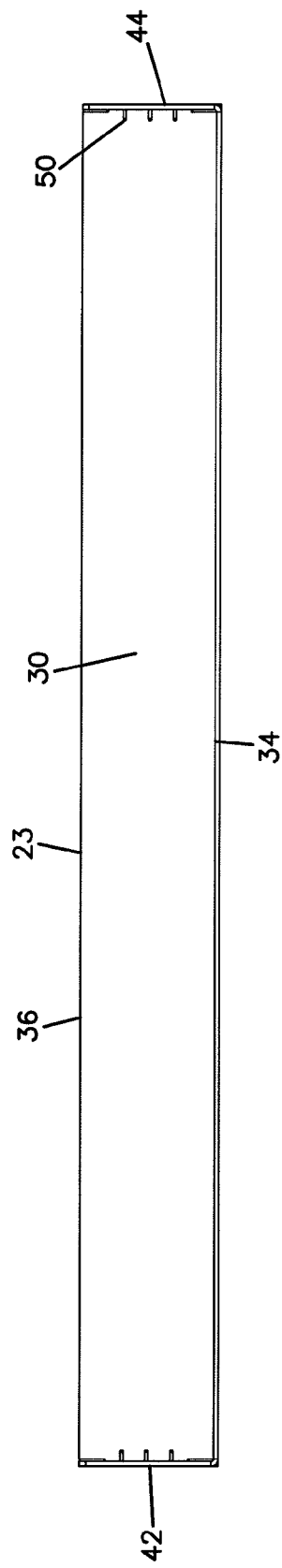
FIG. 6 is a front view of the baffle plate shown in FIG. 5.
Figure 7:
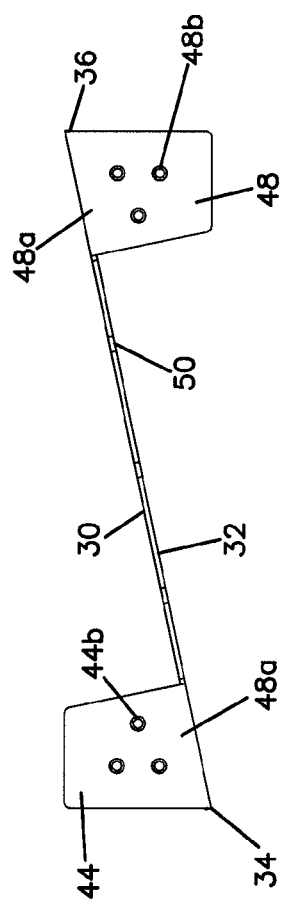
FIG. 7 is a side view of the baffle plate shown in FIG. 5.
Figure 8:
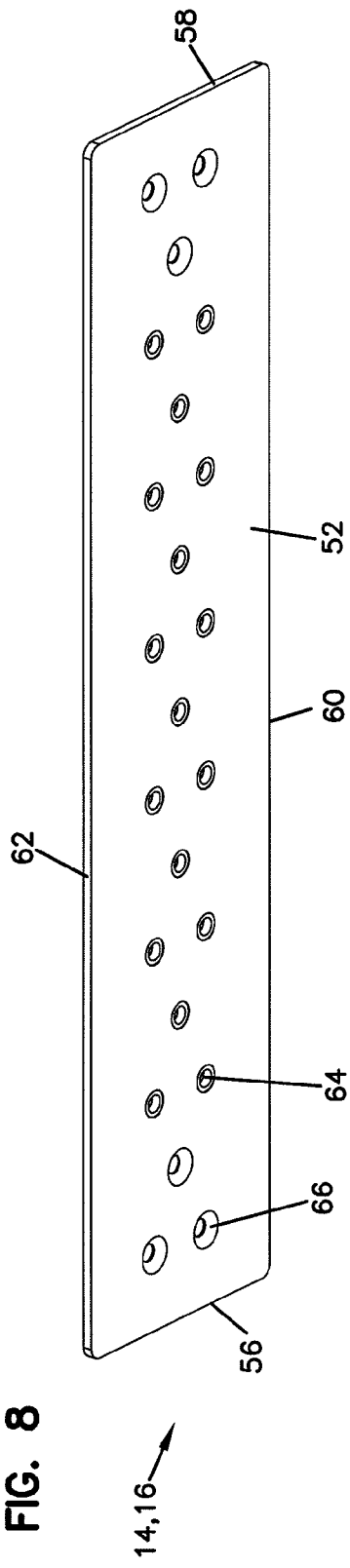
FIG. 8 is a perspective view of one of the side plates of the baffle plate assembly shown in FIG. 1.
Figure 9:
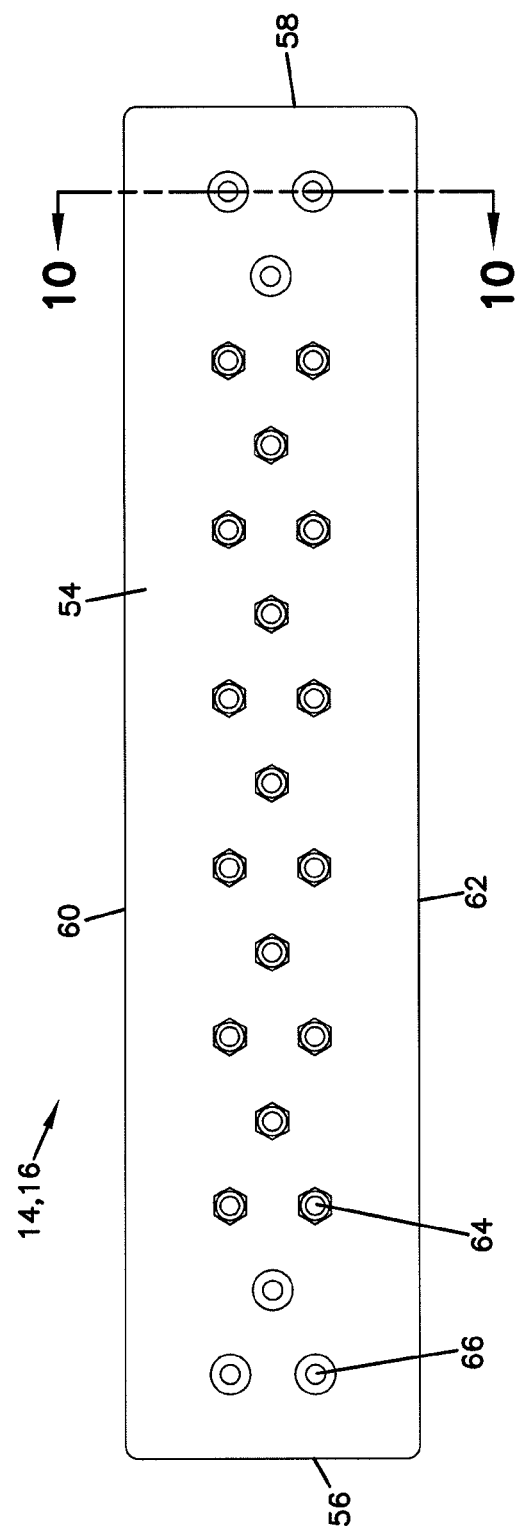
FIG. 9 is a side view of the side plate shown in FIG. 8.
Figure 10:
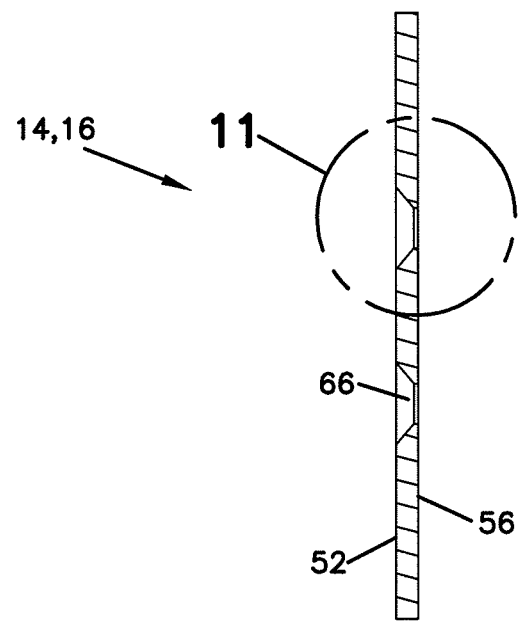
FIG. 10 is a cross-sectional view of the side plate shown in FIG. 8, taken along the line 10-10 shown in FIG. 9.
Figure 11:
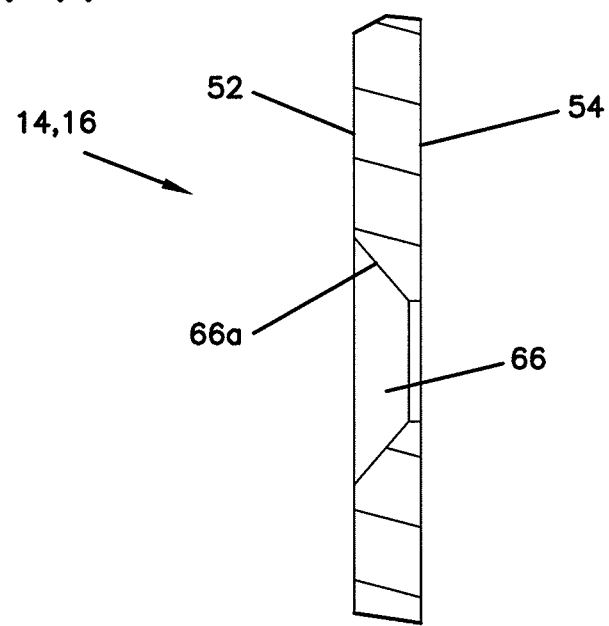
FIG. 11 is an enlarged view of a portion of the side plate shown in FIG. 10, as indicated at detail 11 shown in FIG. 10.
Figure 12:
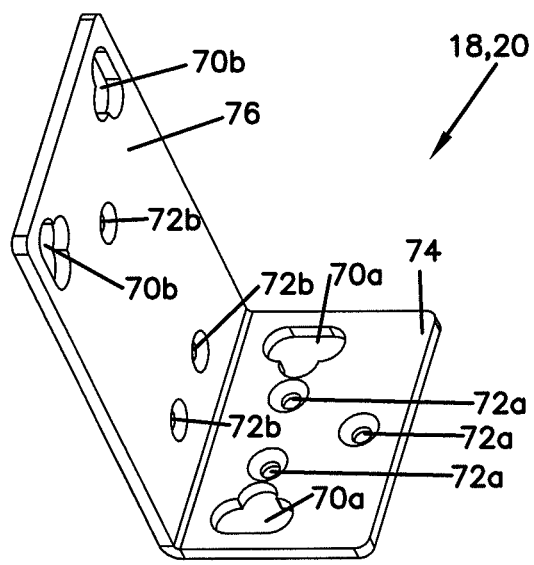
FIG. 12 is a perspective view of a mounting bracket of the baffle plate assembly shown in FIG. 1.
Figure 13:
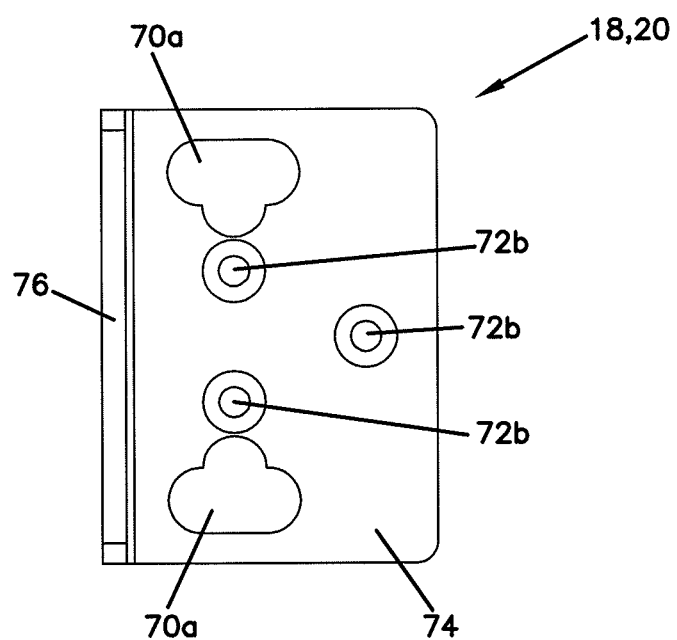
FIG. 13 is a first side view of the mounting bracket shown in FIG. 12.

As most easily seen at FIGS. 5-7, the baffle plate 12 defines a first planar surface 30 and an opposite second planar surface 32. The first and second planar surfaces 30, 32 extend between a front edge 34 and a rear edge 36, and between opposite first and second side edges 38, 40. The baffle plate 12 may also be provided with notches 50 in the first and second edges 38, 40 to accommodate the mounting bracket fasteners 22 in configurations where they pass or extend through the first and second side plates 14, 16 at the location of the baffle plate 12.

The baffle plate 12 is also shown as being provided with one or more support tabs 42, 44, 46, 48. The support tabs 42, 44, 46, 48 are for providing a mounting surface 42a, 44a, 46a, 48a against which the first and second side plates 14, 16 can be secured to the baffle plate 12. In the embodiment shown, the support tabs are integrally formed with the baffle plate 12. However, it should be understood that the support tabs could be produced as separate components that are later attached to the baffle plate 12, such as by welding. The support tabs 42, 44, 46, 48 may also be provided with mounting holes 42b, 44b, 46b, 48b to allow for the mounting brackets 18, 20 fasteners 22 to attach or pass through the support tabs 42, 44, 46, 48. In one embodiment, the mounting holes 42b, 44b, 46b, 48b are pressed in self-clinching fasteners, for example PEW) nuts, that form a permanent part of the support tabs 42, 44, 46, 48.

As configured, support tabs 42 and 46 are located along the first side edge 38 of the baffle plate 12 while support tabs 44 and 48 are located along the second side edge 40 of the baffle plate 12. Support tabs 42 and 44 are located near the front edge 34 of the baffle plate 12 and extend in an first direction away from the first planar surface 30 while support tabs 46 and 48 are located near the rear edge 36 of the baffle plate 12 and extend in a second direction away from the second planar surface 32, the second direction being generally opposite the first direction.

As most easily seen at FIGS. 8 to 11, an example of the first and second side plates 14, 16 is shown. It is noted that each of the first and second side plates 14, 16 can be provided in a generally constant width, rectangular configuration with a symmetrical mounting hole pattern. Accordingly, with the embodiment shown, the same plate can be used for either the first or the second side plate 14, 16. As shown, the side plate 14, 16 has an outboard surface 52 and an opposite mounting surface 54 extending between opposite first and second ends 56, 58 and between opposite first and second side edges 60, 62. In the assembled state, the mounting surface 54 is adjacent to the mounting surfaces 42a, 44a, 46a, 48a of the support tabs 42, 44, 46, 48 while the first end 56 is adjacent the baffle plate front edge 34 and the second end 58 is adjacent the baffle plate rear edge 36.

As shown, each side plate 14, 16 is provided with a plurality of mounting holes 64 and a plurality of through holes 66. The mounting holes 64 are for engaging with fasteners 22 such that the mounting brackets 18, 20 can be attached at incremental points along the side plate 14, 16 at incremental distances from the first end 56. In the embodiment shown, the mounting holes 64 are spaced about one half inch apart along the length of the plates 14, 16. In one aspect, the mounting holes 64 are provided with threads to engage with corresponding threads on fasteners 22. In one embodiment, the mounting holes 64 are pressed in self-clinching fasteners, for example PEM® nuts, that form a permanent part of the side plates 14, 16. Alternatively, mounting holes 64 can perform the function of through holes to allow the fastener 22 to pass through the side plate 14, 16 and engage with another member (e.g. a nut) to clamp the mounting bracket 18, 20 to the side plate 14, 16. The through holes 66 are provided near the ends 56, 58 of the side plate 14, 16 and are configured to align with the corresponding mounting holes 42b, 44b, 46b, 48b on the support tabs 42, 44, 46, 48. In one aspect, the through holes are configured to allow the fasteners 22 to pass through such that the fasteners 22 can engage with the mounting holes 42a, 44a, 46a, 48a. However, the through holes 66 could be configured with an engagement feature, such as threads that engage with corresponding threads on fasteners 22. As most easily seen at FIGS. 10 and 11, the through holes 66 can be provided with a countersink 66a for accepting the head of a fastener 22.

In one aspect, the first side plate 14 is attached to the support tabs 42, 46 and the second side plate 16 is attached to the support tabs 44, 48, for example with mechanical fasteners or by welding. In the embodiment shown, and as most easily seen at FIG. 4, the plates 14, 16 are attached to their respective tabs 42, 44, 46, 48 by a spot welding process resulting in two spot welds 68 per connection. It has been found that the disclosed component configuration utilized in conjunction with using a welding process to join the side plates 14, 16 to the support tabs 42, 44, 46, 48 has the advantage of eliminating front-to-rear sagging of the baffle plate 12 with respect to the side plates 14, 16 and thus the mounting brackets 18, 20, and rack structures 100. As the entire baffle plate assembly 10 is essentially cantilevered on a rack structure 100 significant rotational forces exist at the connection between the mounting brackets 18, 20 and the side plates 14, 16 that tend to induce sagging.

Figure 4:
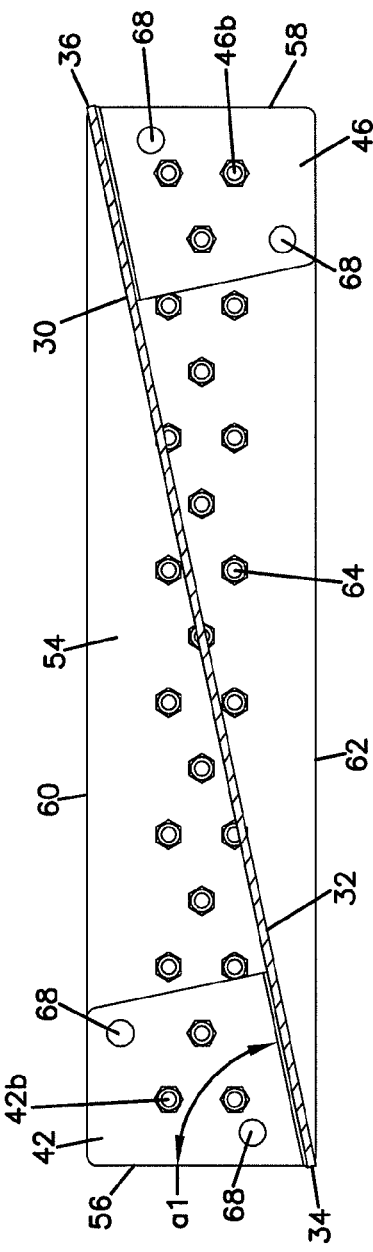
FIG. 4 is a cross-sectional view of the baffle plate assembly shown in FIG. 2, taken along the line 4-4 shown in FIG. 3.

As most easily seen at FIG. 4, the front edge 34 of the baffle plate 12 is adjacent the corner formed by the first end 56 and one of the side edges 60, 62 while the rear edge 36 of the baffle plate 12 is adjacent the corner formed by the second end 58 and the opposite side edge 60, 62. This orientation of the baffle plate results in the formation of an angle a1 between the first planar surface 30 of the baffle plate 12 and the first end 56 of the side plate 14, 16. In one aspect, angle a1 is an oblique angle. In the embodiment shown, angle a1 is about 78 degrees. Other angles are possible.

Figure 18:
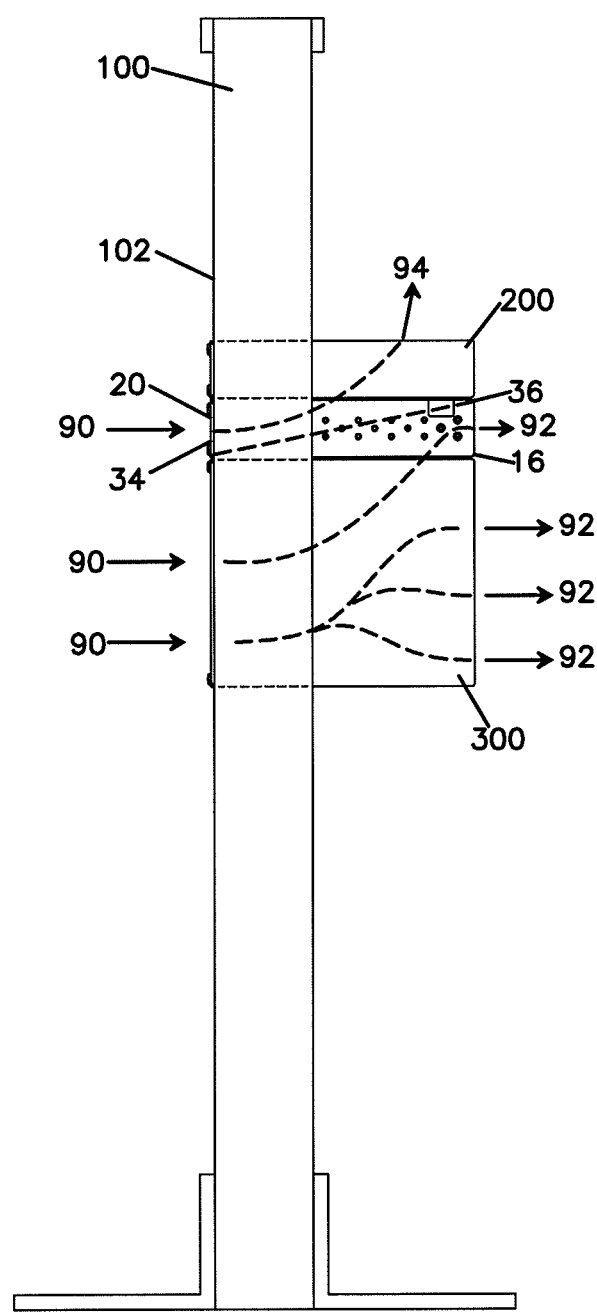
FIG. 18 is a side view of the baffle plate assembly and rack structure shown in FIG. 17.

With reference to FIG. 18, the baffle plate first planar surface 30 acts as an air ramp to ensure that cool air 90 from the front side of the rack structure 100 is delivered to the equipment 200 immediately above the baffle plate assembly 10. Likewise, the baffle plate second planar surface 32 blocks any heated air 92 emanating from below or behind the baffle plate assembly 10, for example from equipment 300. Additionally, the side plates 14, 16 form a channel with the first planar surface 30 that prevents leakage of cool air 90 around the baffle plate assembly 10 side edges 38, 40. The side plates 14, 16 also form a channel with the second planar surface 32 that guides hot air 92 to the rear of the rack structure 100 while preventing the hot air 92 from entering the baffle plate first planar surface via the first and second side edges 38, 40. It is noted that multiple baffle plate assemblies 10 may be used within the same rack structure such that the side plates 14, 16 and second planar surface 32 would guide heated air 94 from equipment 200 to the rear of the rack structure 100 while providing a channel for cool air 90 to other equipment above equipment 200.

Referring now to FIGS. 12-16, each of the mounting brackets 18, 20 has a symmetrical design such that the same component can be used for either the first mounting bracket 18 or the second mounting bracket 20. As shown, the mounting bracket 18, 20 includes tri-lobe apertures 70a, 70b shaped for use with fasteners 78 to secure the mounting bracket 18, 20 to the rack structure 100. The apertures 70a, 70b may be also configured for use with tri-lobe washers of the type described in U.S. Pat. No. 7,171,099 which is hereby incorporated by reference in its entirety. The mounting bracket 18, 20 also has mounting holes 72a, 72b for use with fasteners 22 to secure the mounting bracket 18, 20 to the baffle plate 12 and/or the side plate 14, 16.

As shown, each mounting bracket 18, 20 defines an L-shape with first and second plate members 74, 76 positioned transversely to one another, preferably generally orthogonally at about 90°. As shown, plate member 74 has at least two apertures 72a while plate member 76 has at least two apertures 72b. Apertures 70a, 70b are in the shape of a tri-lobe wherein a rack fastener 78 can be positioned in a variety of locations within aperture 70a, 70b to accommodate a plurality of racks or other mounting fixtures having different hole spacing formats. For example, a tri-lobe opening 70a in first plate member 74 is useful for reducing the number of individual holes needed in bracket 18, 20 when an operator desires to use bracket 18, 20 with different rack formats such as WECO or EIA rack hole spacing.

In a preferred bracket 18, 20, the first plate member 74 that has a greater length than second plate member 76 and is reversible so that second plate member 76 can also be used to mount to the rack, such as in the situation when a wider rack is used. For example, bracket 18, 20 is used as shown in FIGS. 1 and 17-21 for a nominal 19 inch rack. Bracket 18, 20 can be turned so that first plate member 74 is mounted adjacent to the side plate 14, 16. In such an arrangement, the second plate member 76 extends transversely from side plate 14, 16, and the two apertures 70b would be used to receive fasteners 78 to mount the baffle plate assembly 10 to a nominal 23 inch rack. Depending on the hole positions and spacings on each rack, a rack fastener 78 can reside in different portions of apertures 70a, 70b without the need for separate holes for each individual rack format. Preferably all apertures 70a, 70b are tri-lobed for ease of manufacture and use with different racks. Also, the mounting holes 72a, 72b may be provided with a countersink 80 to accommodate the head of a fastener 22, as most easily seen at FIGS. 15 and 16. In the above described configuration, either of the first or second plate members 74, 76 will be in a plane that is parallel to the first end 56 of the side plates 14, 16. Accordingly, the baffle plate first planar surface 30 will form an angle a1 with the plate member 74, 76 that is attached to the rack. As mentioned previously, angle a1 is an oblique angle.

As shown, the baffle plate assembly 10 has an overall height (i.e. the distance between side edges 60, 62) that will allow for installation in a one rack unit space (about 1.75 inches or 44.45 millimeters) in a rack structure 100. In one embodiment, the height of the baffle plate assembly is about 1.75 inches. However, it should be understood that the baffle plate assembly 10 could be configured for other heights, such as two to five rack units, without departing from the concepts presented herein. The baffle plate assembly 10 is also shown as having an overall depth of about 8 inches (i.e. the distance between first end 56 and second end 58) and an overall width (i.e. distance between the outboard surfaces 52 of the first and second side plates 14, 16) of about 17 inches. Other depths are possible as well, for example, depths within the range of about 9 inches to about 12 inches.

Figure 17:
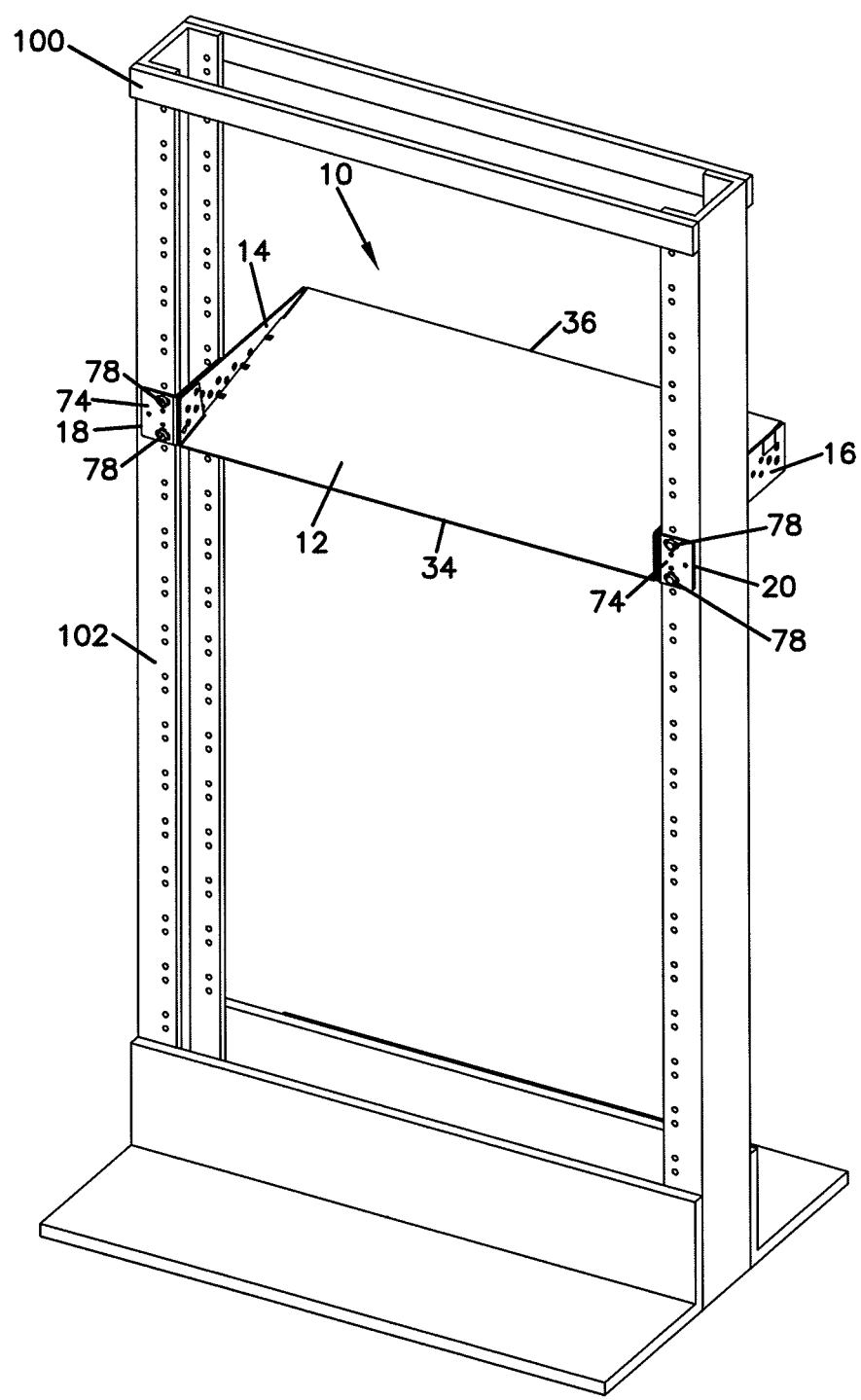
FIG. 17 is a perspective view of the baffle plate assembly shown in FIG. 1 installed in a rack structure in a first configuration.
Figure 19:
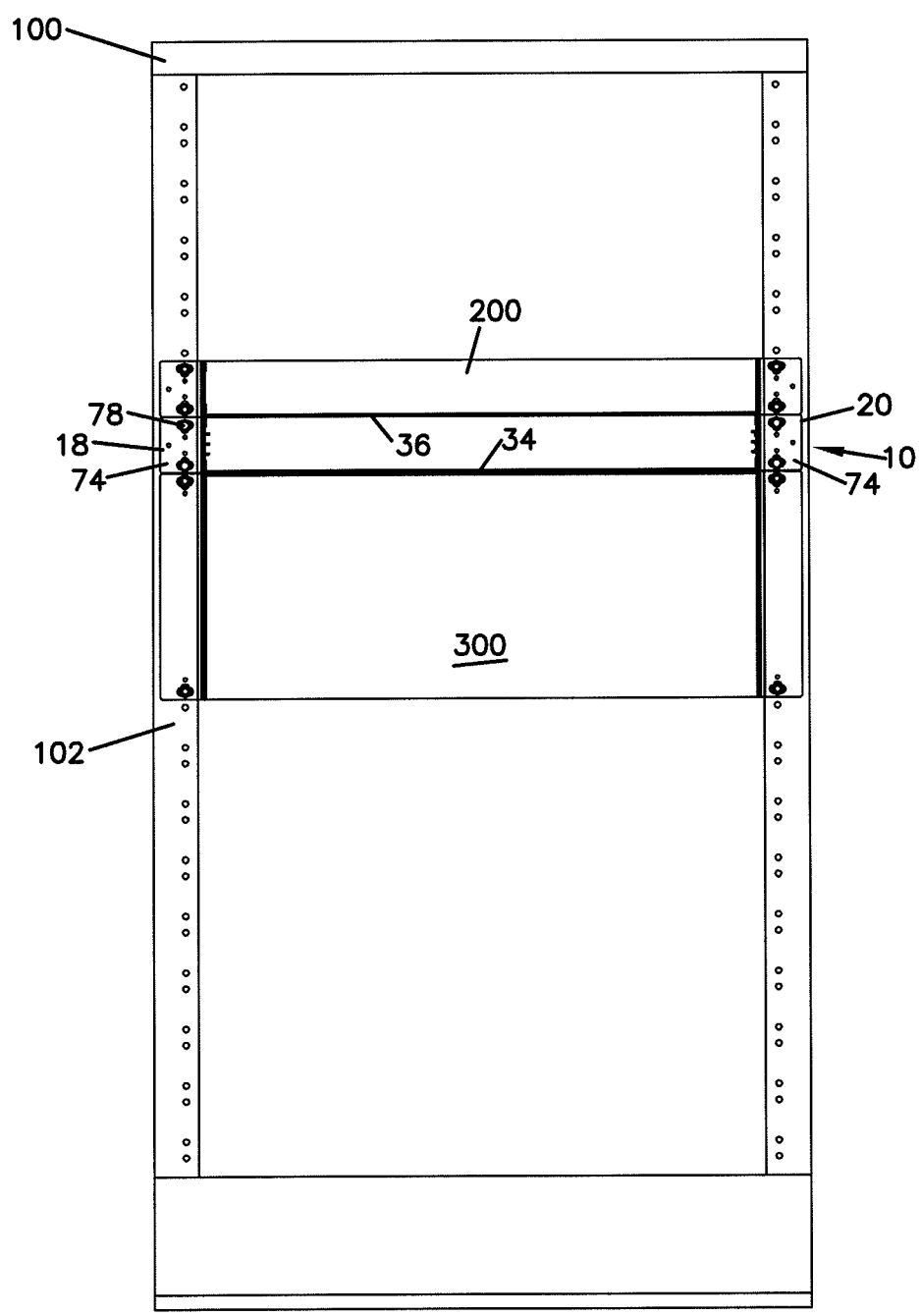
FIG. 19 is a front view of the baffle plate assembly and rack structure shown in FIG. 17.

While including relatively few movable components, the above described baffle plate assembly 10 is highly adaptable to multiple configurations without requiring the installation any additional components or parts. This adaptability is further illustrated at FIGS. 17-22 wherein the baffle plate assembly 10 is shown mounted to the rack structure 100 in various configurations. For example, FIGS. 17-19 show the baffle plate assembly 10 in a flush mounted configuration in which the front edge 34 of the baffle plate 12 is generally even with the front face 102 of the rack structure 100. Also, FIGS. 18 and 19 show, the baffle plate assembly mounted between equipment 200 and 300. In such a configuration, the mounting brackets 18, 20 are mounted as far as possible towards the first end 56 of the respective side plates 14, 16. It is also noted that rack structure 100 is shown as being a standard 19 inch rack. Accordingly, the first plate members 74 of the mounting brackets 18, 20 are attached to the rack structure 100 while the second plate members 76 are attached to the side plates 14, 16.

Figure 20:
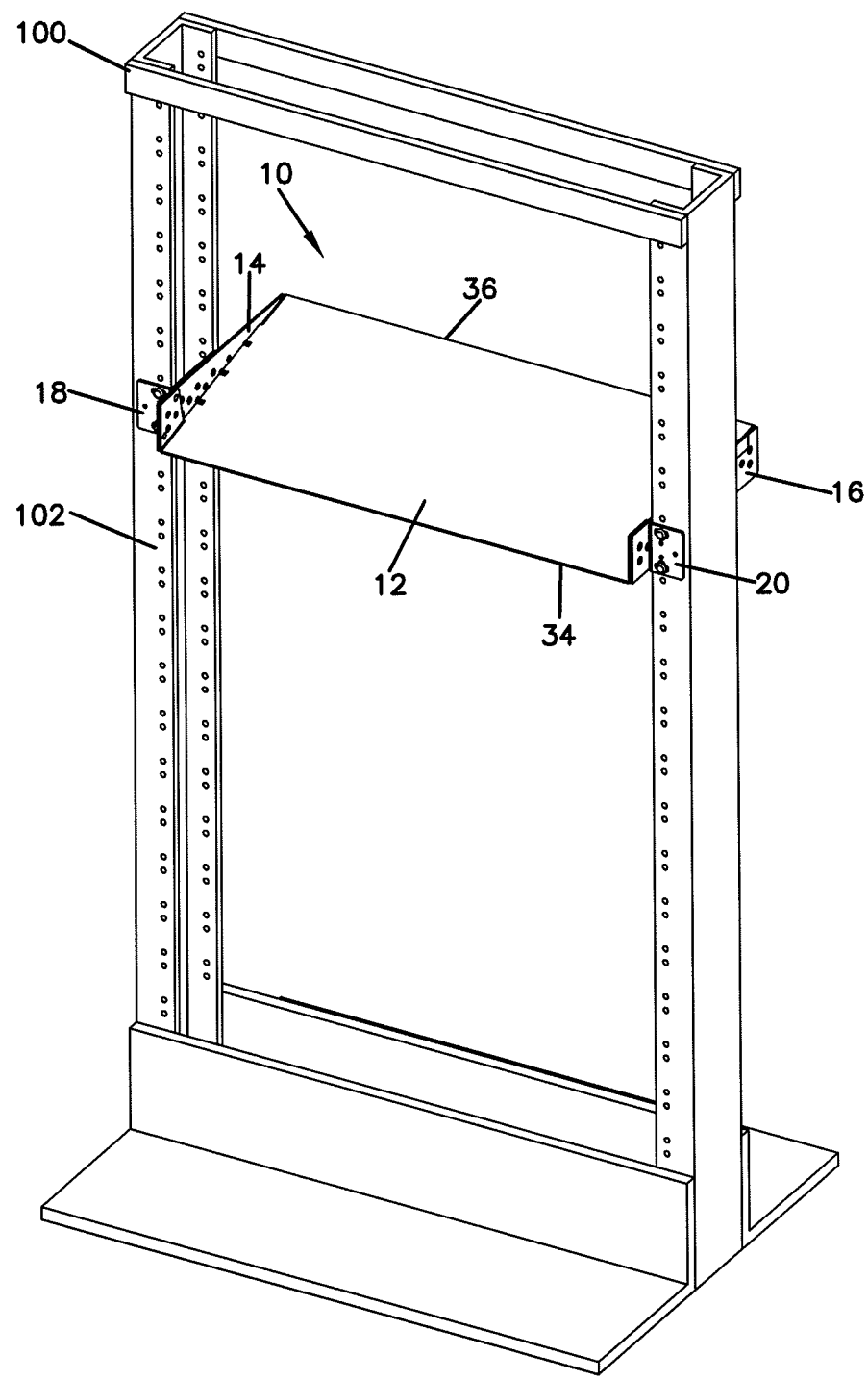
FIG. 20 is a perspective view of the baffle plate assembly shown in FIG. 1 installed in a rack structure in a second configuration.
Figure 21:
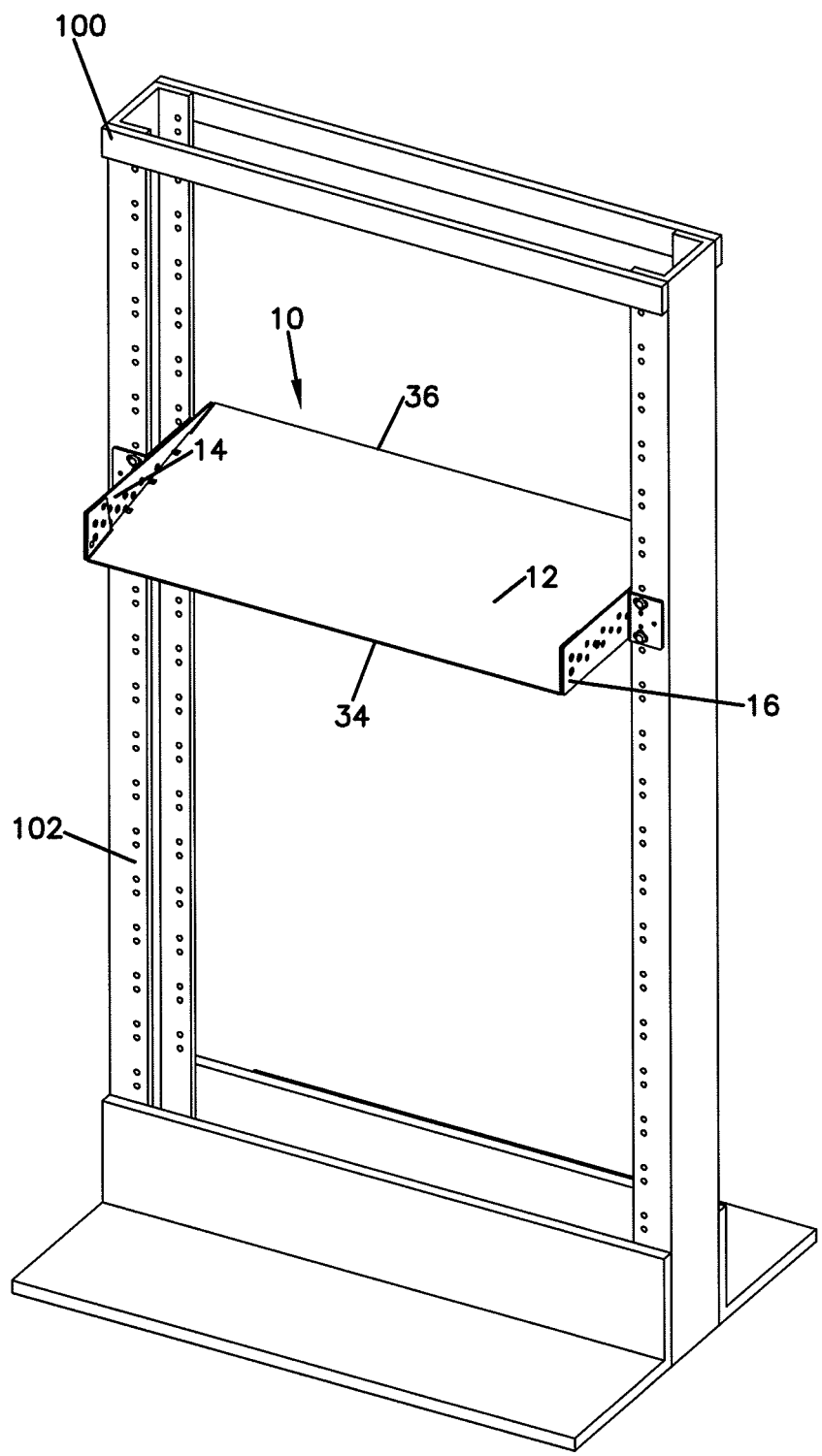
FIG. 21 is a perspective view of the baffle plate assembly shown in FIG. 1 installed in a rack structure in a third configuration.

FIG. 20 shows a configuration in which the mounting brackets 18, 20 are mounted in a recessed position on the side plates 14, 16 such that the front edge 34 of the baffle plate 12 extends about 1 inch beyond the front face 102 of the rack structure 100. FIG. 21 shows yet another configuration in which the mounting brackets 18, 20 are mounted in an even further recessed position on the side plates 18, 20 such that the front edge 34 of the baffle plate 12 extends about 4 inches beyond the front face 102 of the rack structure 100. It should be appreciated that other mounting configurations are possible, as the mounting holes 64 are provided in incremental distances (e.g. about one half inch increments) along the length each of the side plates 14, 16.

Figure 22:
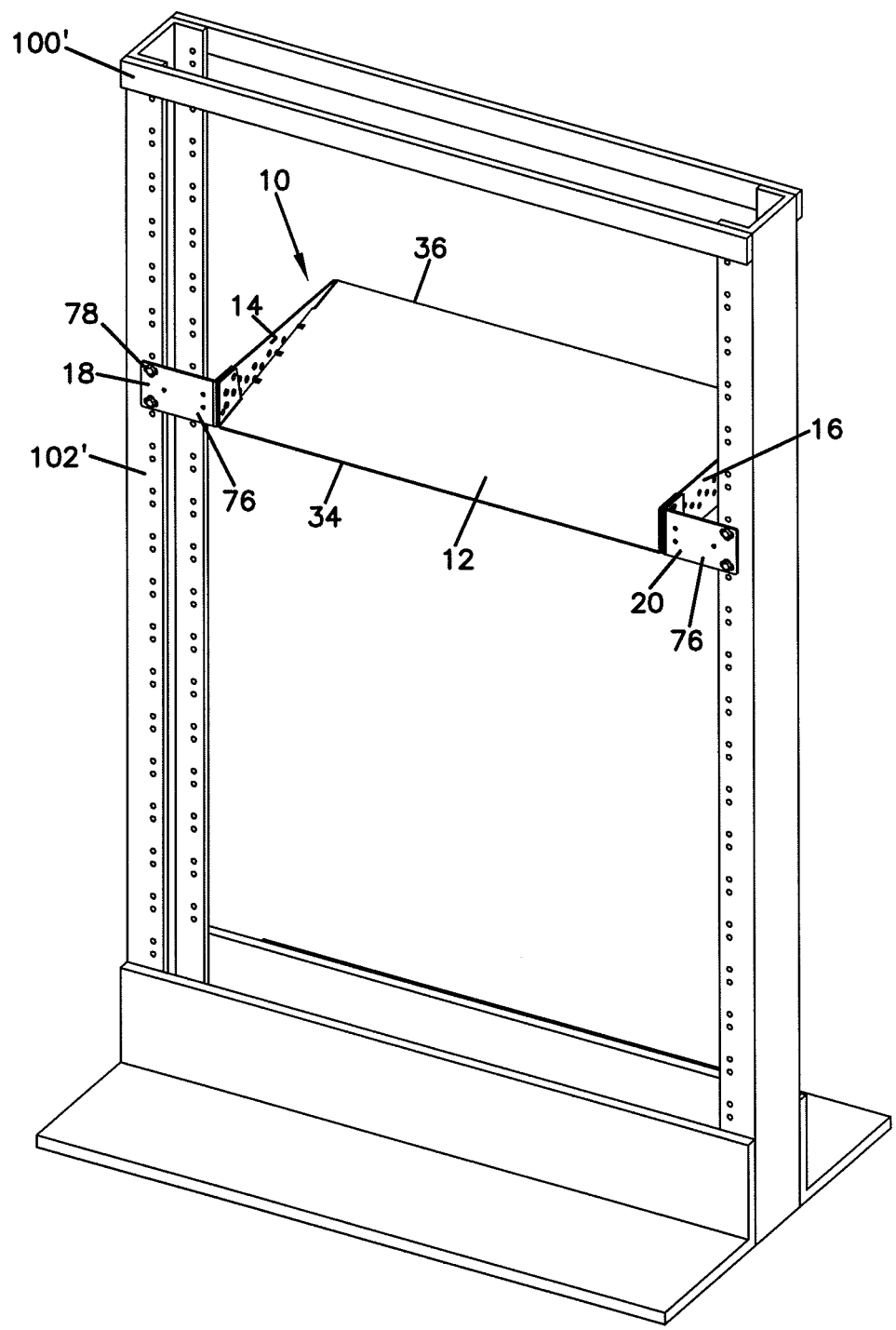
FIG. 22 is a perspective view of the baffle plate assembly shown in FIG. 1 installed in a rack structure in a fourth configuration.

FIG. 22 shows a rack structure 100' that is configured as a standard 23 inch rack. Accordingly, the first plate members 74 of the mounting brackets 18, 20 are attached to the side plates 14, 16 while the second plate members 76 are attached to the rack structure 100'. As shown, the mounting brackets 18, 20 are positioned such that the baffle plate 12 of the baffle plate assembly 10 is generally flush with the front face 102' of the rack structure 102. However, many other positions are possible within the rack structure 100', as described previously.

In example embodiments, the components of the baffle plate assembly 10 are made of a metal material, such as steel. Other materials, such as plastics, can be used.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the disclosure.

What is claimed is:

1. A telecommunications rack structure comprising:
   a. a rack having a front side and a back side;
   b. a first telecommunications equipment piece mounted within the rack structure;
   c. a second telecommunications equipment piece mounted within the rack structure below the first equipment piece;
   d. a baffle plate assembly mounted to the rack between the first and second equipment pieces, the baffle plate assembly being configured to direct air from the front side of the rack to the first equipment piece while directing air heated by the second equipment piece to the back side of the rack to shield the first equipment piece from the air heated by the second equipment piece, the baffle plate assembly including:
      i. a baffle plate defining a first surface plane extending between opposite first and second side edges and extending between a front edge and a rear edge;
      ii. a pair of side plates including a first side plate extending along the first side edge of the baffle plate and a second side plate extending along the second side edge of the baffle plate; and
      iii. a pair of mounting brackets including a first mounting bracket attached to the first side plate and a second mounting bracket attached to the second side plate, each of the pair of mounting brackets having a first plate member and a second plate member wherein:
         a. the first plate member is generally orthogonal to the second plate member;
         b. the first plate member is attached to the first or second side plate;
         c. the second plate member is positioned for attachment to the rack structure;
      iv. wherein the baffle plate is provided with a first pair of support tabs located on the first side edge of the baffle plate and a second pair of support tabs located on the second side edge of the baffle plate, wherein one of the first pair of support tabs is located adjacent the baffle plate front edge and extends away from the baffle plate first surface plane in a first direction and the other of the first pair of support tabs is located adjacent the baffle plate rear edge and extends in a second direction opposite the first direction, and wherein one of the second pair of support tabs is located adjacent the baffle plate front edge and extends away from the baffle plate first surface plane in the first direction and the other of the second pair of support tabs is located adjacent the baffle plate rear edge and extends away from the baffle plate first surface plane in the second direction;
      v. wherein the first surface plane of the baffle plate forms an oblique angle with respect to a plane defined by the first plate member of each of the first and second mounting brackets and wherein the first surface plane of the baffle plate forms an oblique angle with respect to a bottom surface of the first telecommunications equipment piece and forms an oblique angle with respect to a top surface of the second telecommunications equipment piece.

2. The telecommunications rack structure of claim 1, wherein the first and second mounting brackets are respectively attached to the first and second side plates with fasteners.

3. The telecommunications rack structure of claim 2, wherein each of the first and second side plates includes a plurality of spaced mounting holes for receiving the fasteners, and wherein the first and second mounting brackets can be mounted at different locations along the respective first and second side plates.

4. The telecommunications rack structure of claim 1, wherein the first side plate is welded to the one or more support tabs located along the first side edge and the second side plate is welded to the one or more support tabs located along the second side edge.

5. The telecommunications rack structure of claim 4, wherein the first side plate is spot welded to the first pair of support tabs and the second side plate is spot welded to the second pair of support tabs.

6. The telecommunications rack structure of claim 1, wherein the baffle plate assembly is configured to be installed within a single rack unit space of the rack structure.

7. The telecommunications rack structure of claim 1, wherein the first and second mounting brackets are reversible such that the second plate member can be attached to the first or second side plate and the first plate member can be positioned for attachment to the rack structure.

8. The telecommunications rack structure of claim 7, wherein the first plate member of first and second mounting brackets has a length that is greater than a length of the second plate member of the first and second mounting brackets.

9. The telecommunications rack structure of claim 8, wherein the baffle plate assembly can be installed in a rack structure having a nominal width of 19 inches and a rack structure having a nominal width of 23 inches, depending upon the mounting position of the pair of mounting brackets.

10. A baffle plate assembly for installation in a rack structure comprising:
   a. a baffle plate defining a first surface plane extending between opposite first and second side edges and extending between a front edge and a rear edge;
   b. a plurality of support tabs extending from the baffle plate first and second side edges;
   c. a pair of side plates including a first side plate extending along the first side edge of the baffle plate and a second side plate extending along the second side edge of the baffle plate, the first side plate being welded to a first support tab extending from the baffle plate first side edge, the second side plate being welded to a support tab extending from the baffle plate second side edge; and d. a pair of mounting brackets including a first mounting bracket attached to the first side plate and a second mounting bracket attached to the second side plate, each of the pair of mounting brackets having a first plate member that extends transversely from the respective first or second side plates;

e. wherein the first surface plane of the baffle plate forms an oblique angle with respect to a plane defined by the first plate member of each of the first and second mounting brackets;

f. wherein the plurality of support tabs includes a first pair of support tabs located on the first side edge of the baffle plate and a second pair of support tabs located on the second side edge of the baffle plate;

g. wherein one of the first pair of support tabs is located adjacent the baffle plate front edge and the other of the first pair of support tabs is located adjacent the baffle plate rear edge, and wherein one of the second pair of support tabs is located adjacent the baffle plate front edge and the other of the second pair of support tabs is located adjacent the baffle plate rear edge;

h. wherein the support tabs located adjacent the baffle plate front edge extend away from the baffle plate first surface plane in a first direction and the support tabs located adjacent the baffle plate rear edge extend away from the baffle plate first surface plane in a second direction opposite the first direction.

11. The baffle plate assembly of claim 10, wherein the first and second mounting brackets are respectively attached to the first and second side plates with fasteners.

12. The baffle plate assembly of claim 11, wherein each of the first and second side plates includes a plurality of spaced mounting holes for receiving the fasteners, and wherein the first and second mounting brackets can be mounted at different locations along the respective first and second side plates.

13. The baffle plate assembly of claim 10, wherein the first side plate is spot welded to the first pair of support tabs and the second side plate is spot welded to the second pair of support tabs.

14. The baffle plate assembly of claim 10, wherein the baffle plate assembly is configured to be installed within a single rack unit space of the rack structure.

15. A telecommunications rack structure comprising:

a. a rack having a front side and a back side;

b. a first telecommunications equipment piece mounted within the rack structure;

c. a second telecommunications equipment piece mounted within the rack structure below the first equipment piece; and d. the baffle plate assembly of claim 10 mounted to the rack between the first and second equipment pieces.

* * * * *